United States Patent [19]
Kaschmitter

[11] Patent Number: 5,538,564
[45] Date of Patent: Jul. 23, 1996

[54] THREE DIMENSIONAL AMORPHOUS SILICON/MICROCRYSTALLINE SILICON SOLAR CELLS

[75] Inventor: James L. Kaschmitter, Pleasanton, Calif.

[73] Assignee: Regents of the University of California, Oakland, Calif.

[21] Appl. No.: 214,750

[22] Filed: Mar. 18, 1994

[51] Int. Cl.[6] .......................... H01L 31/068; H01L 31/18
[52] U.S. Cl. .......................... 136/255; 136/256; 136/258; 257/458; 257/465; 437/2; 437/4; 437/19; 437/173
[58] Field of Search ..................... 136/255, 256, 136/258 AM, 258 PC; 257/458, 465; 437/2–5, 19, 166, 168, 173

[56] References Cited

U.S. PATENT DOCUMENTS

| | | | |
|---|---|---|---|
| 4,602,120 | 7/1986 | Wakefield et al. | 136/256 |
| 4,675,468 | 6/1987 | Basol et al. | 136/256 |
| 4,703,553 | 11/1987 | Mardesich | 437/2 |
| 4,726,850 | 2/1988 | Wenham et al. | 136/256 |
| 4,781,766 | 11/1988 | Barnett et al. | 136/258 |
| 4,824,489 | 4/1989 | Cogan et al. | 136/256 |
| 5,030,295 | 7/1991 | Swanson et al. | 136/256 |
| 5,053,083 | 10/1991 | Sinton | 136/256 |
| 5,346,850 | 9/1994 | Kaschmitter et al. | 437/81 |

FOREIGN PATENT DOCUMENTS

| | | | |
|---|---|---|---|
| 62-205667 | 9/1987 | Japan | 136/255 |
| 2-267973 | 11/1990 | Japan | 136/255 |

*Primary Examiner*—Aaron Weisstuch
*Attorney, Agent, or Firm*—Henry P. Sartorio; L. E. Carnahan

[57] ABSTRACT

Three dimensional deep contact amorphous silicon/microcrystalline silicon (a-Si/μc-Si) solar cells which use deep (high aspect ratio) p and n contacts to create high electric fields within the carrier collection volume material of the cell. The deep contacts are fabricated using repetitive pulsed laser doping so as to create the high aspect p and n contacts. By the provision of the deep contacts which penetrate the electric field deep into the material where the high strength of the field can collect many of the carriers, thereby resulting in a high efficiency solar cell.

26 Claims, 2 Drawing Sheets

THREE DIMENSIONAL AMORPHOUS SILICON/MICROCRYSTALLINE SILICON SOLAR CELLS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to solar cells, particularly to high efficiency solar cells and method of fabricating same, and more particularly to high efficiency solar cells which use deep p and n contacts formed by pulsed laser doping to create high electric fields within the carrier collection volume material of the cell.

Solar cells are being widely used in a variety of different applications. In space applications, for example, there is a need for light weight, low cost, but high efficiency solar cells.

Over the years, there has been a substantial research and development effort to produce more efficient solar cells without increased cost or weight, particularly for space applications. The following exemplify the more recent efforts.

Wakefield et al., U.S. Pat. No. 4,602,120 issued Jul. 22, 1986 discloses a solar cell wherein a backside reverse p-n junction is formed prior to metalization and a gridded backside metalization material, chosen so that the material penetrates the p-n junction where present, is fired into the wafer.

Basol et al., U.S. Pat. No. 4,675,468 issued Jun. 23, 1987 discloses a thin-film photo voltaic device including a stable front contact current collector grid.

Mardesich, U.S. Pat. No. 4,703,553 issued Nov. 3, 1987 discloses a drive through doping process which involves substrate heating for manufacturing low back surface recombination solar cells. Deep impurity dotted regions are provided under the back contacts of the cell using a process wherein a metal paste drives through an oxide layer and alloy with selected regions of a p+ type layer and a p– type layer to a predetermined depth thereby forming heavily doped p+ regions.

Wenham et al., U.S. Pat. No. 4,726,850 issued Feb. 23, 1988 discloses a buried contact solar cell wherein an electrical contact is formed in a groove in the surface of the semiconductor material.

Barnett et al., U.S. Pat. No. 4,781,766 issued Nov. 1, 1988 discloses a thin-film solar cell made up of semiconductor layers formed on an aluminum silicon eutectic alloy substrate.

Cogan et al., U.S. Pat. No. 4,824,489 issued Apr. 25, 1989 discloses a method for processing solar cells which involves thinning silicon substrates and a transparent substrate, such as glass, is secured to the silicon by a low temperature adhesive prior to the thinning operation to prevent breaking of the thinned silicon substrate. An amorphous doped semiconductor material is applied to the back surface of the thinned silicon substrate and exposed to pulsed laser energy for melting the amorphous material without causing thermal damage to the adhesive material bonding the thinned silicon substrate to the glass substrate.

Swanson et al., U.S. Pat. No. 5,030,295 issued Jul. 9, 1991 discloses a silicon solar cell wherein the interface of a silicon oxide passivation layer and a silicon substrate in a silicon solar cell is stabilized by a layer of undoped or phosphorous doped polycrystalline silicon.

Sinton, U.S. Pat. No. 5,053,083 issued Oct. 1, 1991 discloses a bi-level contact solar cell wherein the back surface of the cell is patterned by etching into an array of bi-level, interdigitated mesas and trenches, separated by inclined surfaces.

While these prior efforts have served to advance the state of solar cells and fabrication techniques therefor, there is a need for higher efficiency solar cells. Such a need is provided by the present invention wherein the solar cell uses deep contacts which penetrate the electric field deep into the material where the high strength of the field can collect many of the carriers. This is especially beneficial for materials such as polycrystalline, microcrystalline, and amorphous silicon, which all have limited carrier lifetimes relative to crystalline silicon (c-Si), due to recombination sites at grain boundaries and open bond sites. The deep contacts are provided by repetitive pulsed laser doping.

SUMMARY OF THE INVENTION

It is an object of the present invention to provide high efficiency solar cells.

A further object of the invention is to provide a method for fabricating solar cells which include deep p and n contacts formed by repetitive pulsed laser doping.

Another object of the invention is to provide three dimensional deep contact amorphous silicon/microcrystalline silicon solar cells using pulsed laser processing which includes repetitive pulsed laser doping to form the deep contacts.

Other objects and advantages provided by the present invention will become apparent from the following description and accompanying drawings. The invention involves high efficiency solar cells and method for fabricating same. The invention is a three dimensional deep contact amorphous silicon/microcrystalline silicon (a-Si/μc-si) solar cell which uses deep (high aspect ratio) p and n contacts to create high electric fields within the carrier collection volume material of the cell. The deep contacts are formed using repetitive pulsed laser doping so as to create the high aspect p and n contacts. The deep contacts penetrate the electric field deep into the material where the high strength of the field can collect many of the carriers.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1:
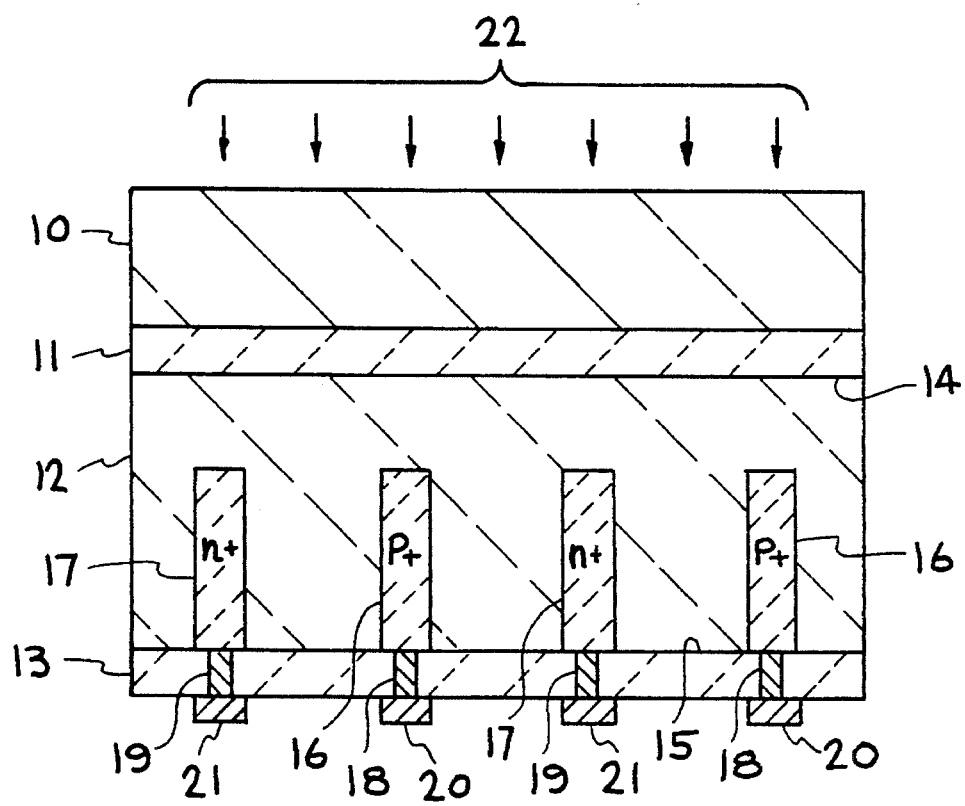
FIG. 1 is a perspective (edge) view of an embodiment of a three dimensional solar cell illustrating the deep contacts made in accordance with the invention.

Solar cells according to the present invention are designed with the intent of providing deep contacts for carrier collection. Carrier lifetimes in amorphous-silicon (a-Si) and microcrystalline silicon (μc-Si) are extremely short in contrast to crystalline silicon (c-Si). Positive (p) and negative (n) carriers must therefore be separated and collected near p and n terminals prior to recombination. The problem with both a-Si and μc-Si is that, although they are absorbers (especially a-Si), the lifetimes are so short that it is necessary to thin the material to be able to collect the carriers. Typically, top and bottom contact a-Si solar cells are a few thousand angstroms (Å) thick, since the fields will not penetrate any further, and the short carrier lifetimes don't allow the carriers to diffuse to where they can be collected.

The deep contact solar cell of this invention puts the p and n junctions deep into the absorbing or active carrier collection volume material so that carriers can be picked up deep within the absorbing material itself, rather than at the top and bottom of the absorbing layer. Tests have shown that the deep contacts can be placed close enough together so as to produce a strong collecting field throughout the absorbing material.

The solar cell of this invention is a a-Si/μc-Si analogy of that of the Swanson et al. (U.S. Pat. No. 5,030,295, referenced above) back contact cell for crystalline silicon. Swanson et al. used 2-D back contacts, with very high purity, long-lifetime c-Si, since the carrier lifetimes in c-Si are so long as to not require 3-D contacts.

It is thus seen that the invention is directed to high efficiency three dimensional deep contact amorphous silicon/microcrystalline silicon solar cells, with the solar cells utilizing deep p and n contacts to create high electric fields within the carrier collection volume material of the cell. The collection material can be amorphous silicon (a-Si) and/or pulsed laser processed a-Si to form microcrystalline silicon (μc-Si), or a graduation of a-Si to μc-Si around the contacts. The deep contacts are formed using repetitive pulsed laser doping, to create high aspect ratio p and n contacts. Aspect ratio is defined as the ratio of the longer dimension to the shorter dimension. The high electric fields generated throughout the collection material by the deep contacts results in very high current collection. The resulting doped μc-Si contacts also have lower resistivity for reduced voltage drop. The pulsed laser processing of a-Si to create μ-Si results in a carrier collection material which has better mobilities and lower bandgap than a-Si, resulting in higher efficiencies. The deep contacts can be formed on the front or the back of the cell, however the back of the cell is preferred due to reduced light blocking.

While the present invention uses pulsed laser processing to convert (melt and recrystallize) at least segments of a layer of amorphous silicon to microcrystalline silicon, such a process has been previously developed, and has been utilized in solar cell fabrication, as exemplified by above-referenced U.S. Pat. No. 4,824,489. In addition to the use of pulsed laser processing of the a-Si to a-Si/μc-Si, the present invention uses repetitive pulsed laser doping to create the deep (high aspect ratio) p and n contacts, which penetrate the electric field deep into the carrier collection material where the high strength of the field can collect many of the carriers. This is especially important for collection materials such as polycrystalline silicon, microcrystalline silicon, and amorphous silicon, which all have limited carrier lifetimes, relative to crystalline silicon (c-Si), due to recombination sites at grain boundaries and open bond sites.

FIG. 1 illustrates an edge view of an embodiment of a three dimensional, deep contact, a-Si/μ-Si solar cell of the present invention. Unlike Swanson's c-Si solar cell, referenced above, which requires semiconductor processing, the solar cell of this invention is designed for large-area roll-to-roll processing of sheets of material. The solar cell of this invention is fabricated "upside-down" on a transparent substrate to avoid the backside contacts blocking incident light. The transparent substrate indicated at 10 in FIG. 1 is preferably made of the so-called low-temperature plastic ethylene-chloro-trifluoroethylene (E-CTFE) made under the trademark HALAR by Ausimont U.S.A., Inc., since it is ultra-violet (uv) resistant. However, other clear plastics, such as polyvinylidene flouride (PVDF) may be used as the substrate. A low-temperature plastic is defined as a plastic which is incapable of withstanding sustained processing temperatures of higher than about 180° C. Sustained processing means a time period of longer than about $10^5$ nanoseconds (ns). Copending U.S. application Ser. No. 07/968,561, filed Oct. 29, 1992, entitled "Crystallization And Doping Of Amorphous Silicon On Low Temperature Plastic", by James L. Kaschmitter et al., now U.S. Pat. No. 5,346,850 issued Sep. 13, 1994 and assigned to the same assignee, describes and claims pulsed laser processing using various types of "low-temperature" plastics, and such is incorporated herein by reference.

Figure 3:
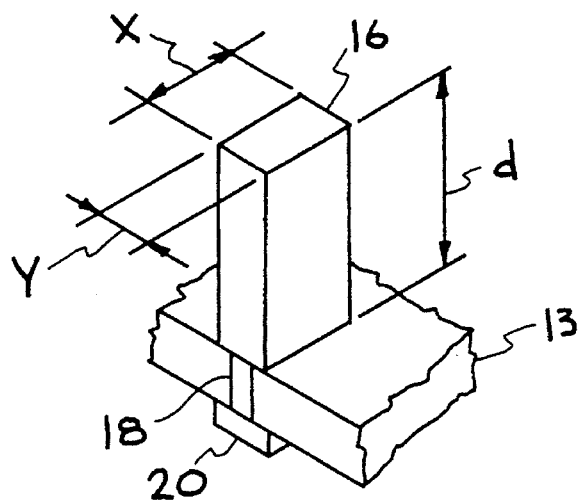
FIG. 3 is an enlarged view of a deep contact of FIG. 1.

As seen in FIG. 1, and as described in greater detail hereinafter, a layer 11 of silicon dioxide ($SiO_2$) is deposited on the clear plastic (E-CTFE) substrate 10, followed by a layer 12 of absorbing or active (carrier collection volume) material, such as a carrier collection material composite of amorphous silicon:hydrogenate/microcrystalline silicon:hydrogenate a-Si:H/μc-Si:H), on which is deposited a layer 13 of silicon dioxide ($SiO_2$), after a plurality of p+ and n+ deep contacts indicated at 16 and 17 are formed. Thus, layers 11 and 13 of $SiO_2$ are deposited on the front or top and the back or bottom surfaces or sides indicated at 14 and 15 of active material layer 12. The $SiO_2$ layer 11 provides a transparent thermal barrier between the low temperature plastic substrate 10 and the layer 12 of active material, thereby preventing sustained heating of the substrate above about 180° C. and thus enabling the use of lower cost transparent plastics in the fabrication of solar cells, and onto which is directed ultra-violet (uv) radiation, as indicated by the arrows 22. The layer 13 provides a protective layer for the material 12. Active material or layer 12 is provided with a plurality of p+ and n+ deep contacts or junctions 16 and 17, respectively, extending inwardly from the back or bottom surface 15 of active material layer 12. FIG. 3 illustrates an enlarged view of deep contact 16, as described in greater detail hereinafter. While the deep contacts 16 and 17 are illustrated as being rectangular in cross-section, in actual practice they are of an inward tapering or cone configuration due to thermal buildup on the outer portions thereof during laser processing. The p+ contacts 16 are formed in active material 12 using repetitive pulsed laser energy in an appropriate environment, while the n+ contacts 17 are formed in a similar manner but with a different dopant.

Note that the contacts 16 and 17 extend over half-way into the active material layer 12 environment, as described hereinafter. Due to the thermal buildup during laser processing some gradation of a-Si to μc-Si will be located around the p and n contacts 16 and 17.

As pointed out above, the p+ and n+ contacts 16 and 17 are formed in active material layer 12 prior to depositing $SiO_2$ layer 13 thereon. Layer 13 is provided with electrical contacts or connectors 18 and 19 for the p+ and n+ contacts 16 and 17, respectively, which are formed in $SiO_2$ layer 13 by pulsed laser doping, as described hereinafter. Bus bars or metal grids 20 and 21 for each electrical connector 18 and 19, composed of copper or aluminum, for example, or other electrically conductive material, are deposited on SiO$_2$ layer 13, and are adapted to be connected to a point of use.

Figure 2:
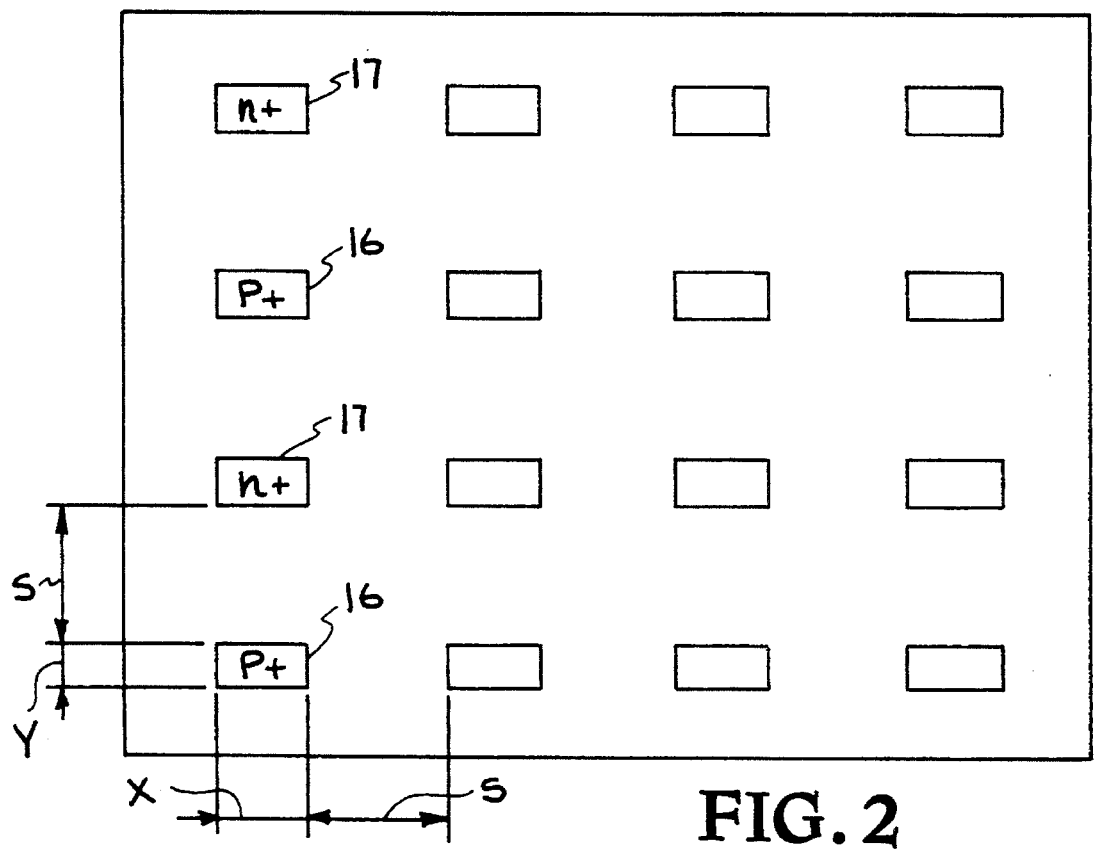
FIG. 2 is a plan view illustrating the deep contact spacing.

By way of example, the substrate 10 of clear plastic may have a thickness of 5 mils, but may be thicker or thinner depending on the application, and the length and width of the substrate may vary depending on the intended use and may constitute a large-area roll. The SiO$_2$ layers 11 and 13 may have a thickness of 500–1000 Å, for example, and the active material layer 12 may have a thickness of 1000–100,000 Å, for example. The high aspect ratio contacts 16 and 17 may have varying depths or lengths indicated at "d" and have uniform spacing indicated at "s" in FIG. 2 with the inner ends having dimensions "x" and "y" of varying amounts, as exemplified in FIGS. 2 and 3 and described hereinafter. The parameters of the contacts 16 and 17 will vary with the various applications and the type of active material utilized in layer 12, but preferably extend at least half-way into the active material. While the active material 12 is exemplified herein as a-Si:H/μc-Si:H, other materials such as polycrystalline silicon (pc-Si) or crystalline silicon (c-Si), may be utilized. Also SiO$_2$ layers 11 and 13 could also be composed of titanium oxide (TiO$_2$), tantalum oxide (TaO$_2$), aluminum oxide (Al$_2$O$_3$), and magnesium oxide (MgO).

Figure 4:
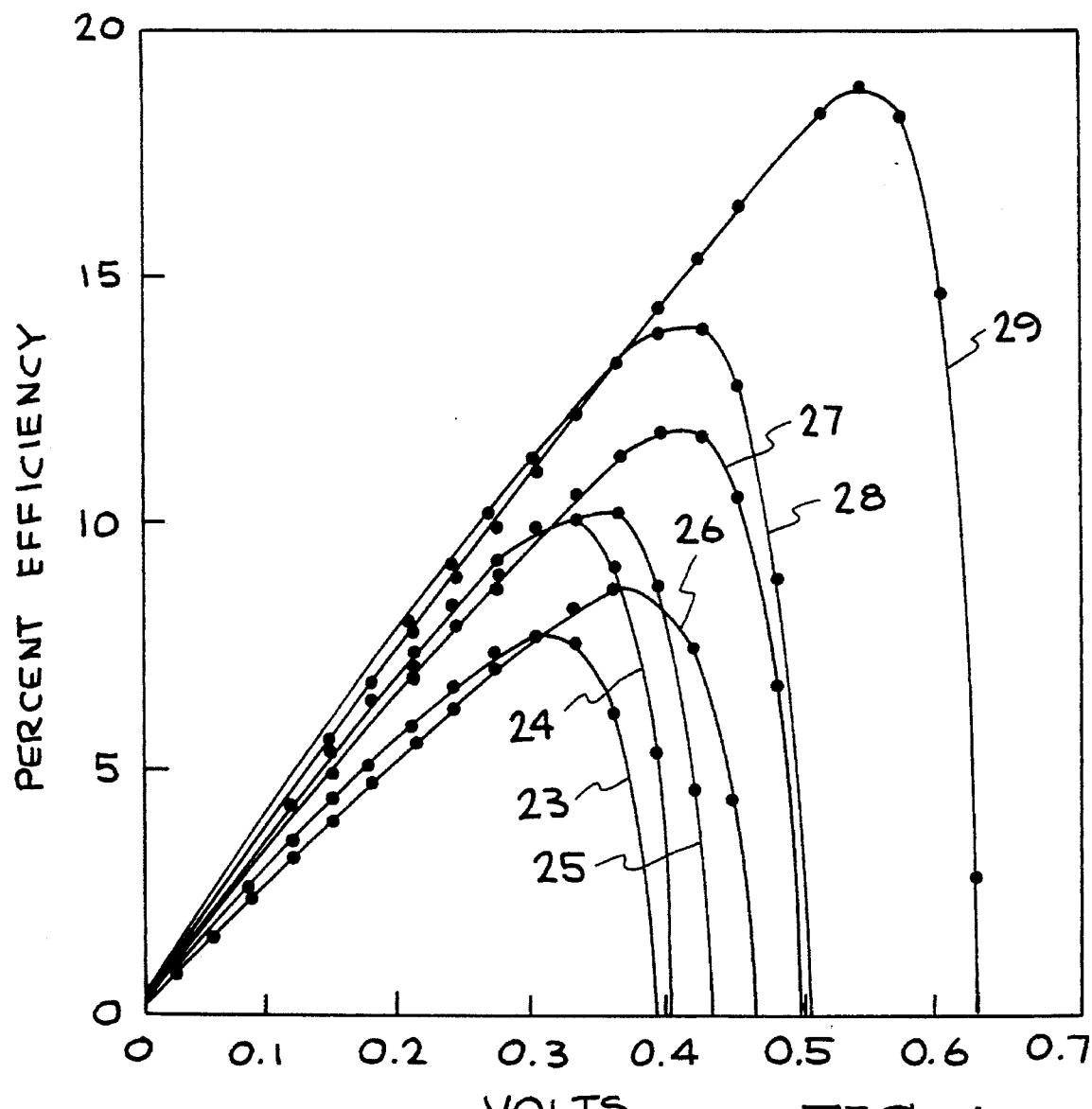
FIG. 4 is a graph showing the comparison of efficiencies of various deep contact configurations in various microcrystalline silicon (μc-Si) carrier collection volume material.

FIG. 4 shows simulated efficiencies achievable with the solar cell of this invention for seven (7) different physical design characters of the contacts 16 and 17, as indicated by curves 23–29 with all parameters being in microns. Curve 23 illustrates the design characteristics of μc-Si 10×5, 10×0.2; curve 24 is μc-Si 5×4, 5×0.2; curve 25 is μc 10×2.8, 8×0.2; curve 26 is μc-Si 1×1, 1×0.5; curve 27 is μc-Si 10×2, 9×0.2; curve 28 is μc-Si 5×2, 5×0.2; and curve 29 is μc-Si 10×1, 4×0.1. The first two numbers are the x, y dimensions of the p and n contacts. The second two numbers are the contact spacing(s) and depth (d). Highest efficiency was for a 1 μ×1 μ square contact on 1 μ centers, 0.5 μ deep, with the absorbing material depth being 1 μ and composed of μc-Si (curve 26). The x-axis of FIG. 4 assumes different solar cell operating voltages. High doping concentrations and activation (>10$^{20}$) were assumed.

By way of example, the three dimensional deep (high aspect ratio) contact a-Si/μc-Si solar cell of FIG. 1 may be fabricated using a large roll of transparent, low temperature, ultra-violet-resistant plastic as the substrate material (substrate 10) and sputtering a layer of SiO$_2$ (layer 11) thereon. Next, thin layers (0.1 to 5 μ) of a-Si are deposited on the layer of SiO$_2$ to produce a desired thickness of the active material (layer 12) by sputtering at 100° C. in an O$_2$-containing atmosphere, or by other techniques such as MOCVD, PECVD, etc. The process must use a low substrate temperature (<about 180° C). The cell is then placed in an atmosphere (boron or phosphorous based), depending on the type of contact 16 or 17 to be formed (p or n) and exposed to repetitive pulsed laser energy. The dopant environment may be boron trifluoride (BF$_3$) for the p-type contact or phosphorous pentafluoride (PF$_5$) for the n-type contact, using an XeCl excimer laser producing 30 ns (FWHM) pulses of 308 nm light totaling approximately one joule per pulse with about 5 seconds between pulses. In addition, other dopants such as B$_2$H$_6$ may be used for the p-type contacts and dopants such as AsF$_5$, AsH$_4$, and PH$_3$ may be used for the n-type contacts. Also, the contacts 16 and 17 may be formed by other gaseous source dopants or by predeposited dopant material which is activated by laser energy. These laser pulses resulted in a change of the crystalline structure of the a-Si layer forming the active material layer 12, and produced doped μc-Si regions. Following the formation of the contacts or junctions 16 and 17 in active material layer 12, a protective layer of SiO$_2$ (layer 13) was deposited, as by sputtering, onto the surface 15 of layer 12, whereafter the electrical connections 18 and 19 were formed in SiO$_2$ layer 13 via pulsed laser processing in either a boron or a phosphorous environment. Next the metal grids or bus bars 20 and 21 were deposited on the appropriate contacts 18 or 19 by sputtering or electroplating. The pulsed laser processing technique, as well as the sputtering technique, are now well established and described in greater detail in above-referenced copending application Ser. No. 07/968,561, now U.S. Pat. No. 5,346,850.

Pulsed laser processing typically entails applying short (~35 ns) pulses of laser energy (0.1–1 Jcm$^{-2}$) to silicon, for example, in vacuum or a dopant gas atmosphere. Other pulsed high energy sources, such as KrF and ArF excimer lasers, e-beams, flashlamps, dye lasers, and YAG lasers may be utilized instead of the XeCl excimer laser, and the pulse length may be varied from 5–60 ns depending on the energy of the source. The a-Si and/or SiO$_2$ layers may also be deposited by plasma enhanced chemical vapor deposition (PECVD). Other low-temperature materials such as poly-ethersulfone (PES), ethylene-tetrafluoro ethylene (E-TFE), poly-tetra-fluoro-ethylene (PTFE), fiberglass enhanced plastic (FEP), and high density poly-ethylene (HDPE) may be used as the substrate provided such has sufficient ultra-violet (uv) transparency as needed for the specific application in which it is to be utilized. Also, the transparent thermal barrier layer 11 (SiO$_2$) may be formed from other material which has sufficient transparency to uv radiation and thermal barrier characteristics to protect the low-temperature substrate from damage during laser processing.

It has thus been seen that the present invention provides a high efficiency solar cell by the use of deep p and n contacts to create high electric fields within the carrier collection volume material of the cell, with the collection material being a-Si and/or pulsed laser processed a-Si to form μc-Si. The deep contacts are formed in the collection material by using repetitive pulsed laser doping, which penetrate the electric field deep into the collector material where the high strength of the field can collect many of the carriers. The pulsed laser processing may be carried out by excimer, dye, and YAG lasers, for example. The repetitive pulsed laser doping may be carried out with pulse lengths of 5–60 ns, energy levels of 150 to 800 mJ cm$^{-2}$, and pulse spacing of about 5 seconds.

While a specific embodiment has been illustrated using specific materials, sizes, etc., and the process for fabricating the solar cell has been limited to the specific embodiment, such is not intended to be limiting as to doping environments, laser parameters, or type of pulsed laser. Various applications for the solar cell may require different materials, dopants, and laser processing parameters. Modifications and changes will become apparent to those skilled in the art, and it is intended that the scope of the invention be limited only by the appended claims.

I claim:

1. In a process for fabricating solar cells, the improvement comprising:

forming high aspect ratio contacts in a carrier collection material by repetitive pulsed laser doping to create p and n contacts having a depth substantially greater than the width thereof, resulting in very high current collection, thus providing an efficient solar cell.

2. The improvement of claim 1, additionally including forming the carrier collection material from the group consisting of amorphous silicon, amorphous silicon containing microcrystalline silicon formed by laser processing, and a graduation of amorphous silicon to microcrystalline silicon adjacent the contacts.

3. The improvement of claim 1, wherein the repetitive pulsed laser doping is carried out using a laser selected from the group of excimer, flashlamp, dye, and YAG lasers.

4. The improvement of claim 1, wherein the p and n contacts are formed by repetitive pulsed laser doping carried out in a gaseous dopant environment or on predeposited dopant materials.

5. The improvement of claim 1, wherein the repetitive pulsed laser doping for forming the p contacts is carried out in an environment of a dopant selected from the group consisting of $BF_3$, $B_2H_6$, and other p-type gaseous dopant environments.

6. The improvement of claim 1, wherein the repetitive pulsed laser doping for forming the n contacts is carried out in an environment of a dopant selected from the group consisting of $PF_5$, $AsF_5$, $AsH_4$, $PH_3$, and other n-type gaseous dopant environments.

7. The improvement of claim 1, wherein the repetitive pulsed laser doping is carried out with a pulse length of 5 to 60 ns, energy level of about 150 to 800 mJcm$^{-2}$, and pulse spacing of about 5 seconds.

8. The improvement of claim 1, additionally including forming the carrier collection material from the group consisting of a-Si:H/μc-Si:H, pc-Si, and c-Si.

9. The improvement of claim 1, additionally including forming layers of material on opposite sides of the carrier collection material from the group consisting of $SiO_2$, $TiO_2$, $TaO_2$, $Al_2O_3$, and MgO.

10. In a solar cell having a carrier collection material, the improvement comprising:

said carrier collection material containing only a plurality of high aspect ratio p and n contacts therein;

said plurality of high aspect ratio p and n contacts having a depth substantially greater than the width thereof which penetrate the electric field at least half-way into the carrier collection material where the high strength of the electric field can collect the carriers, said p and n contacts being composed of doped carrier collection material.

11. The improvement of claim 10, wherein the plurality of high aspect ratio p and n contacts are formed in the carrier collection material by repetitive pulse laser doping of areas in the carrier collection material.

12. The improvement of claim 11, wherein the carrier collection material is selected from the group composed of amorphous silicon, laser processed amorphous silicon containing microcrystalline silicon, and a graduation of amorphous silicon to microcrystalline silicon around the contacts.

13. The improvement of claim 12, additionally including a plurality of layers of silicon dioxide, at least one layer thereof being on opposite sides of said carrier collection material.

14. The improvement of claim 13, additionally including a plurality of electrical connectors extending through one of said silicon dioxide layers and in contact with said p and n contacts.

15. The improvement of claim 14, wherein said electrical connectors are also in contact with bus bars located on an outer surface of said one of said silicon dioxide layers.

16. The improvement of claim 15, additionally including a layer of ultra-violet transparent material located on an outer surface of another of said layers of silicon dioxide and adapted to be positioned to receive solar radiation.

17. The improvement of claim 16, wherein said layer of transparent material is formed from the group consisting of E-CTFE, PVDF, E-TFE, PES, PTFE, FEP, HDPE, and other low-temperature polymeric materials which are incapable of withstanding temperatures of over about 180° C. for a sustained time period longer than about 10$^5$ ns.

18. The improvement of claim 10, wherein said carrier collection material is selected from the group consisting of a-Si:H/μc-Si:H, pc-Si, and c-Si.

19. The improvement of claim 10, additionally including a layer of material selected from the group consisting of $SiO_2$, $TiO_2$, $TaO_2$, $Al_2O_3$, and MgO on opposite sides of the carrier collection material.

20. A process for fabricating three dimensional deep contact a-Si/μc-Si solar cells, comprising:

depositing a layer of a transparent thermal barrier material on a uv radiation transparent substrate;

depositing a layer of active material on the transparent thermal barrier material;

forming by pulsed energy processing a plurality of doped high aspect ratio contacts in said active material which extend deep into said active material;

depositing a layer of protective material on the layer of active material;

forming doped electrical connectors in said layer of protective material which align with the contacts formed in the active material; and providing a conductive grid means in contact with said doped electrical connectors.

21. The process of claim 20, additionally including forming the substrate from material selected from the group of E-CTFE, PVDF, E-TFE, PES, PTFE, FEP, and HDPE.

22. The process of claim 21, wherein at least one of the layers of thermal barrier material and protective material is composed of $SiO_2$.

23. The process of claim 22, wherein said layer of active material is composed of a-Si:H/μ-Si:H.

24. The process of claim 23, wherein said plurality of doped high aspect ratio contacts comprise at least one p and one n contacts.

25. The process of claim 24, wherein said doped contacts are formed by repetitive pulsed laser processing and extend at least half-way into said layer of active material.

26. The process of claim 20, wherein at least one of the layers of thermal barrier material and protective material is composed of at least one of the group consisting of $SiO_2$, $TiO_2$, $TaO_2$, $Al_2O_3$, and MgO.

* * * * *